US009653890B2

(12) United States Patent
Foerster

(10) Patent No.: US 9,653,890 B2
(45) Date of Patent: May 16, 2017

(54) METERING APPARATUS FOR LOAD CENTERS

(71) Applicant: Eaton Corporation, Cleveland, OH (US)

(72) Inventor: Andrew Jay Foerster, Wexford, PA (US)

(73) Assignee: Eaton Corporation, Cleveland, OH (US)

(*) Notice: Subject to any disclaimer, the term of this patent is extended or adjusted under 35 U.S.C. 154(b) by 312 days.

(21) Appl. No.: 14/139,267

(22) Filed: Dec. 23, 2013

(65) Prior Publication Data
US 2015/0177288 A1 Jun. 25, 2015

(51) Int. Cl.
*G01R 1/20* (2006.01)
*H02B 1/03* (2006.01)
*H05K 5/00* (2006.01)
*H05K 5/02* (2006.01)
*G01D 11/24* (2006.01)

(52) U.S. Cl.
CPC ............ *H02B 1/03* (2013.01); *G01D 11/245* (2013.01); *H05K 5/0017* (2013.01); *H05K 5/0247* (2013.01)

(58) Field of Classification Search
CPC ........ G01R 1/20; G01R 19/25; H05K 5/0247; H05K 5/0017; H02B 1/03; G01D 11/245
USPC .................... 324/126, 424; 700/12
See application file for complete search history.

(56) References Cited

U.S. PATENT DOCUMENTS

| 5,249,115 | A | * | 9/1993 | Reid | .................... | G05B 19/042 |
| | | | | | | 700/12 |
| 5,552,978 | A | * | 9/1996 | Moncorge | ................. | G01R 1/20 |
| | | | | | | 323/223 |
| 5,627,724 | A | * | 5/1997 | Leach | ..................... | H02B 1/03 |
| | | | | | | 361/622 |
| 5,870,276 | A | * | 2/1999 | Leach | ..................... | H02B 1/03 |
| | | | | | | 361/627 |

(Continued)

FOREIGN PATENT DOCUMENTS

| WO | WO 93/00665 A1 | 1/1993 | |
| WO | WO 9300665 A1 * | 1/1993 | ............ H02J 13/001 |

(Continued)

OTHER PUBLICATIONS

International Search Report and Written Opinion Corresponding to International Application No. PCT/US2014/070726; Date of Mailing: Mar. 25, 2015; 11 Pages.

(Continued)

*Primary Examiner* — Patrick Assouad
*Assistant Examiner* — Sean Curtis
(74) *Attorney, Agent, or Firm* — Myers Bigel, P.A.

(57) ABSTRACT

An apparatus includes a housing configured to be mounted at a breaker position of a load center and supporting at least one electrical connector configured to be electrically coupled to a bus bar of the load center. A graphical display is disposed at a face of the housing. A control circuit is disposed in the housing, electrically coupled to the at least one electrical connector and configured to control the graphical display. The control circuit may be further configured to be coupled to an external sensor, such as a current sensor. The control circuit may be configured to perform an electrical measurement and to display a result of the measurement on the graphical display.

16 Claims, 8 Drawing Sheets

(56) References Cited

U.S. PATENT DOCUMENTS

| | | | | |
|---|---|---|---|---|
| 6,018,700 | A * | 1/2000 | Edel | G01R 19/2513 361/18 |
| 6,798,209 | B2 * | 9/2004 | Lavoie | G01R 31/3277 324/424 |
| 7,385,406 | B1 * | 6/2008 | Blades | G01R 31/041 324/424 |
| 7,566,986 | B2 * | 7/2009 | DeBoer | H02J 13/0062 307/31 |
| 7,907,388 | B2 * | 3/2011 | DeBoer | H02J 13/0062 307/38 |
| 8,027,134 | B2 * | 9/2011 | Ziegler | H01R 13/6666 361/600 |
| 8,625,748 | B2 * | 1/2014 | Kioski | H04Q 1/15 361/636 |
| 9,088,644 | B2 * | 7/2015 | Kioski | H04Q 1/15 |
| 9,124,077 | B2 * | 9/2015 | Robinson | H02B 1/03 |
| 9,214,832 | B2 * | 12/2015 | Rusch | H02J 7/34 |
| 2003/0132753 | A1 * | 7/2003 | Lavoie | G01R 31/3277 324/424 |
| 2006/0238932 | A1 * | 10/2006 | Westbrock, Jr. | H02H 1/0038 361/42 |
| 2007/0064360 | A1 * | 3/2007 | DeBoer | H02J 13/0062 361/62 |
| 2007/0064377 | A1 * | 3/2007 | DeBoer | H02J 13/0062 361/637 |
| 2007/0103835 | A1 * | 5/2007 | Sorenson | B63J 99/00 361/114 |
| 2007/0158171 | A1 * | 7/2007 | Deboer | H01H 89/06 200/331 |
| 2008/0100140 | A1 * | 5/2008 | Sorenson | H02J 13/0062 307/40 |
| 2009/0050455 | A1 * | 2/2009 | Meckler | H01H 71/04 200/314 |
| 2009/0206059 | A1 * | 8/2009 | Kiko | H02J 3/14 218/143 |
| 2009/0315732 | A1 * | 12/2009 | Dobusch | H02H 3/04 340/638 |
| 2010/0052655 | A1 * | 3/2010 | King | G01R 22/06 324/103 R |
| 2010/0207604 | A1 * | 8/2010 | Bitsch | G01R 21/133 324/140 R |
| 2012/0326518 | A1 * | 12/2012 | Rusch | H02J 7/34 307/80 |
| 2012/0327563 | A1 * | 12/2012 | Cook | H02J 4/00 361/624 |
| 2013/0021163 | A1 * | 1/2013 | Watford | H02H 3/046 340/638 |
| 2013/0108027 | A1 * | 5/2013 | Kioski | H04Q 1/15 379/27.05 |
| 2014/0099820 | A1 * | 4/2014 | Robinson | H02B 1/03 439/517 |
| 2014/0119519 | A1 * | 5/2014 | Kioski | H04Q 1/15 379/32.01 |
| 2015/0012145 | A1 * | 1/2015 | Kiko | H02J 3/14 700/291 |
| 2015/0177288 | A1 * | 6/2015 | Foerster | H05K 5/0017 324/126 |
| 2015/0377934 | A1 * | 12/2015 | Choe | G01R 19/2513 361/631 |

FOREIGN PATENT DOCUMENTS

| | | | | |
|---|---|---|---|---|
| WO | WO 93/13465 A1 | 7/1993 | | |
| WO | WO 9313465 A1 * | 7/1993 | | G05B 19/042 |
| WO | WO 2015047269 A1 * | 4/2015 | | H02J 3/00 |
| WO | WO 2015053761 A1 * | 4/2015 | | G01R 15/183 |

OTHER PUBLICATIONS

International Preliminary Report on Patentability Corresponding to International Application No. PCT/US2014/070726; Date of Mailing: Jul. 7, 2016; 7 Pages.

* cited by examiner

METERING APPARATUS FOR LOAD CENTERS

FIELD

The inventive subject matter relates generally to load centers and, more particularly, to apparatus for installation in load centers.

BACKGROUND

Load centers are commonly used to distribute power in industrial, commercial and residential applications. A typical load center includes a sheet metal enclosure with a power distribution structure mounted therein that is configured to support division of a main circuit feed into multiple branch circuits. Typically, the branch circuits are protected by respective circuit breakers that are designed to be plugged or bolted on to bus bars of the load center. The breakers may be of various types, such as thermal magnetic breakers, arc fault breakers and ground fault breakers. The breaker locations are typically arranged in a two-column array. The main feed to the bus bars may be protected by a larger main breaker.

Energy efficiency and other requirements have led to a demand for more sophisticated monitoring and control of electrical distribution systems. For example, the desire for increased energy efficiency has driven a demand for metering of loads coupled to particular load centers. Existing approaches for providing such metering capabilities include adding metering devices that are designed to be appended to the load center or to be installed in vacant spaces within the load center enclosure.

SUMMARY

Some embodiments of the inventive subject matter provide an apparatus including a housing configured to be installed at a breaker position of a load center and at least one electrical connector supported by the housing and configured to engage a bus bar of the load center. A graphical display is disposed at a face of the housing. A control circuit is disposed in the housing, electrically coupled to the at least one electrical connector, and configured to control the graphical display. The control circuit may be further configured to be coupled to an external sensor, such as a current sensor. The control circuit may be configured to perform an electrical measurement and to display a result of the measurement on the graphical display.

In some embodiments, the apparatus may further include a user input device configured to receive a user input from a user positioned at the load center. In further embodiments, the apparatus may include a communications circuit in the housing, operatively coupled to the control circuit and configured to communicate with a device external to the housing.

Some embodiments of the inventive subject matter provide an apparatus including a housing configured to be mounted at a breaker position of a load center and at least one connector supported by the housing and configured to engage a bus bar of the load center. A control circuit is disposed in the housing, electrically coupled to the at least one connector and configured to perform at least one electrical measurement. An interface device is disposed in the housing, operatively coupled to the control circuit and configured to communicate the at least one electrical measurement to a user. In some embodiments, the interface device may include a graphical display mounted at a face of the housing. In some embodiments, the interface device may include a communications circuit in the housing and configured to communicate with a device external to the housing. The interface device may also be configured to accept a user input from a human user positioned at the load center.

Still further embodiments provide an apparatus including a housing configured to be mounted at a breaker position of a load center and at least one electrical connector supported by the housing and configured to engage a bus bar of the load center. An alphanumeric display is disposed at a face of the housing. A control circuit is disposed in the housing, electrically coupled to the at least one electrical connector and configured to perform at least one electrical metering operation and display a result of the at least one electrical metering operation on the alphanumeric display. The apparatus may further include a user input device supported by the housing, operatively coupled to the control circuit and configured to accept a user input from a user positioned at the load center. The apparatus may further include a communications circuit in the housing, operatively coupled to the control circuit and configured to communicate the result of the at least one electrical metering operation to a device external to the housing.

DETAILED DESCRIPTION

Figure 1:
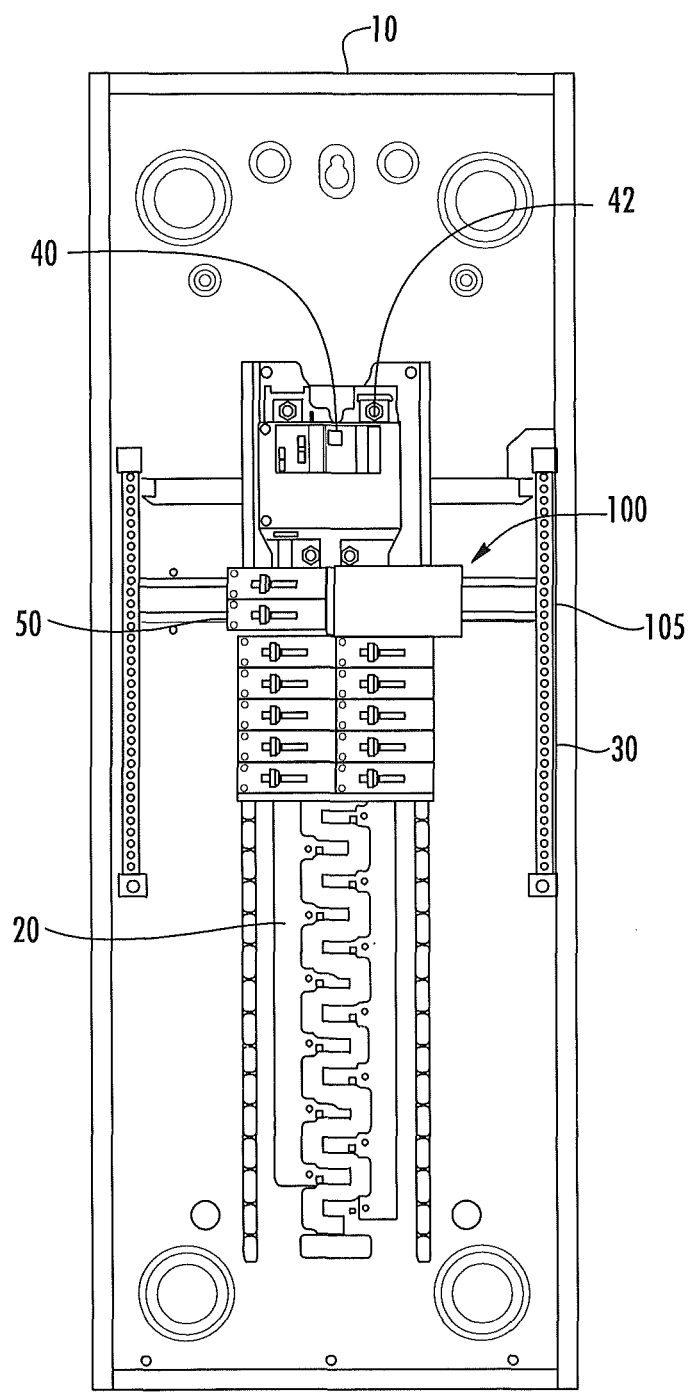
FIG. 1 illustrates an apparatus according to some embodiments installed in a load center.

The inventive subject matter now will be described more fully hereinafter with reference to the accompanying drawings, in which illustrative embodiments of the inventive subject matter are shown. In the drawings, the relative sizes of regions or features may be exaggerated for clarity. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout. As used herein the term "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the expression "and/or" includes any and all combinations of one or more of the associated listed items.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
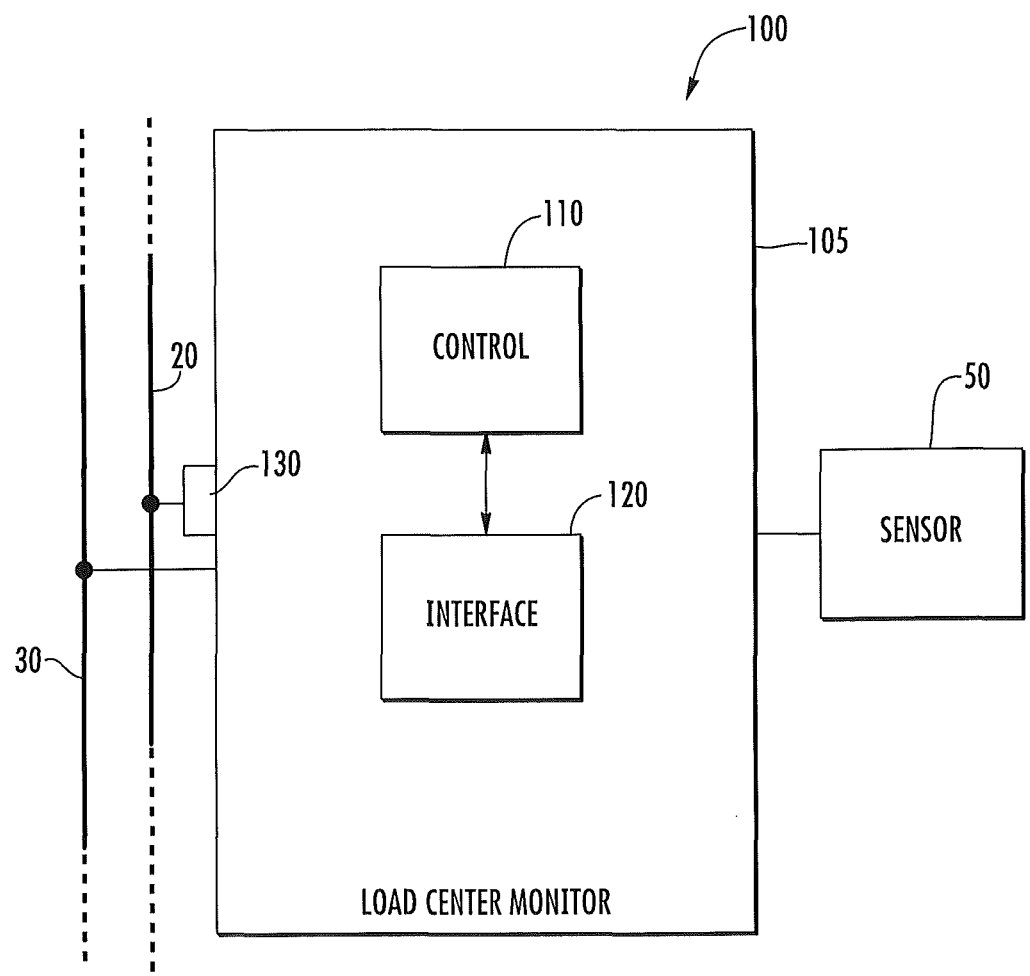
FIG. 2 is a schematic diagram of the apparatus of FIG. 1.
Figure 3:
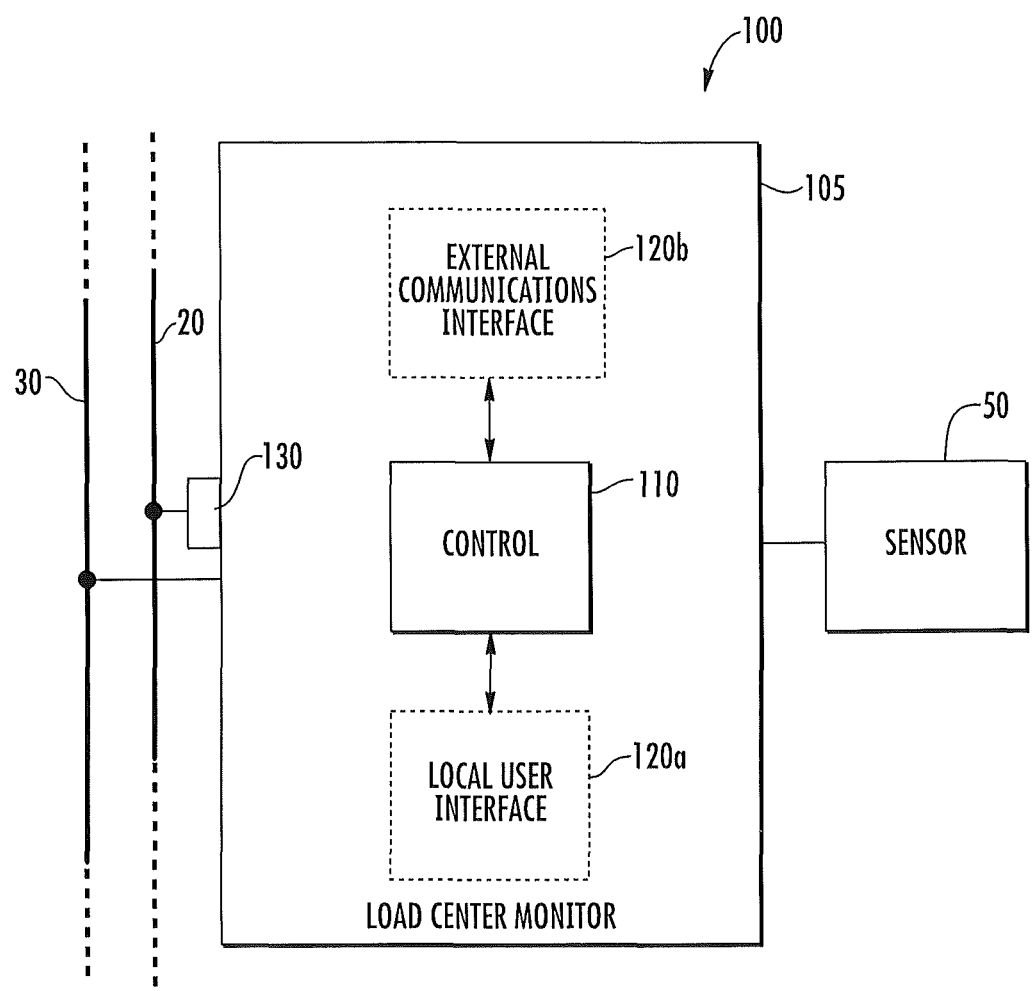
FIG. 3 is a schematic diagram of the apparatus of FIG. 1 according to further embodiments.
Figure 4:
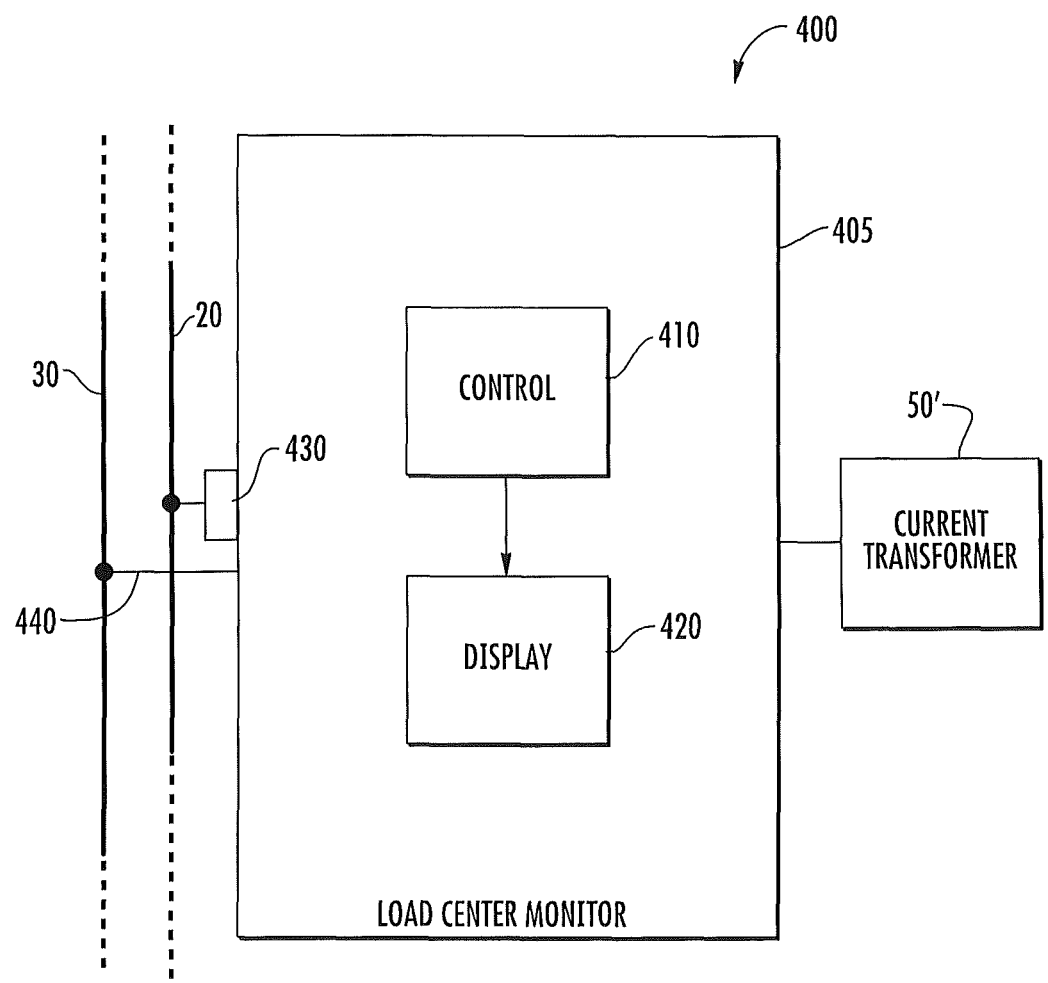
FIG. 4 is a schematic diagram of an apparatus according to additional embodiments.
Figure 5:
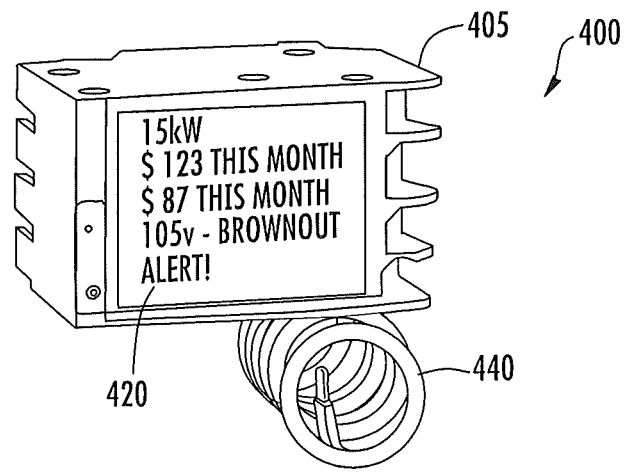
FIG. 5 is a perspective view of the apparatus of FIG. 4.

FIGS. 1-3 illustrate apparatus according to some embodiments of the inventive subject matter. A load center includes an enclosure 10, e.g., a sheet metal box, having knockouts or other features in its walls that support passage of wiring to components within the enclosure 10. The load center further includes a power distribution structure including at least one bus bar 20 and at least one neutral bar 30 mounted in the enclosure 10. Power may be provided to the bus bars 20 via a main breaker 40, to which conductors (e.g., service entrance cable conductors) are connected using lug-type connectors 42. Branch circuit breakers 50 may be installed in columns at spaced apart positions. The branch circuit breakers 50 may plug on, bolt on or otherwise electrically connect to the bus bars 20. The branch circuit breakers 50 may also be connected to the at least one neutral bar 30.

According to some embodiments, a metering apparatus 100 includes a housing 105 configured to be installed at one or more of the branch circuit breaker locations of the load center such that it is electrically coupled to at least one of the bus bars 20. As shown in FIG. 2, the metering apparatus 100 may include a control circuit 210 configured to be coupled to at least one bus bar 20 of the load center via at least one connector 130, using a connection similar to that used by the breakers 50, e.g., a plug-on or bolt-on connection. The apparatus 100 may also be connected to at least one neutral bar 30 of the load center.

The apparatus 100 further includes an interface device 120, which may include, for example, a display, a user input device and/or an external communications device, operatively coupled to the control circuit 110. The control circuit 110 may also be configured to be coupled to at least one external sensor 50. In some embodiments, the control circuit 110 may be configured to perform measurements of at least one electrical quantity associated with operation of the load center using input from the connected at least one bus bar 20 and/or the connected at least one sensor 50. The control, circuit 110 may also be configured to determine a status of the load center, such as a load, fault or other condition. The control circuit 110 may communicate a result of the measurement and/or the determined status using the interface device 120. For example, as shown in FIG. 3, the control circuit 110 may communicate a measurement result using a local user interface device (e.g., a display) 120a and/or using an external communications interface device 120b that supports communication with an external device via, for example, a wired (e.g., Ethernet or power line carrier), radio (e.g., WiFi) or optical communications link. The control circuit 110 and the interface device 120 may also be powered from the connected at least one bus bar 20.

It will be appreciated that the control circuit 110 may be implemented using analog and digital circuitry, such as microcontroller and peripheral circuitry. The interface device 120 may include any of a number of different types of analog and/or digital circuitry, as well as mechanical components (e.g., buttons or switches).

According to some embodiments, a metering apparatus for installation in a branch circuit breaker position in a load center may be configured to measure and/or compute voltage, current, power and/other electrical quantities associated with operation of the load center, and may include an integral alphanumeric display, such as an LCD display, that may be used to display such information to a user at the load center. The apparatus may also be configured to determine load center status, such as loading and/or fault conditions.

Figure 6:
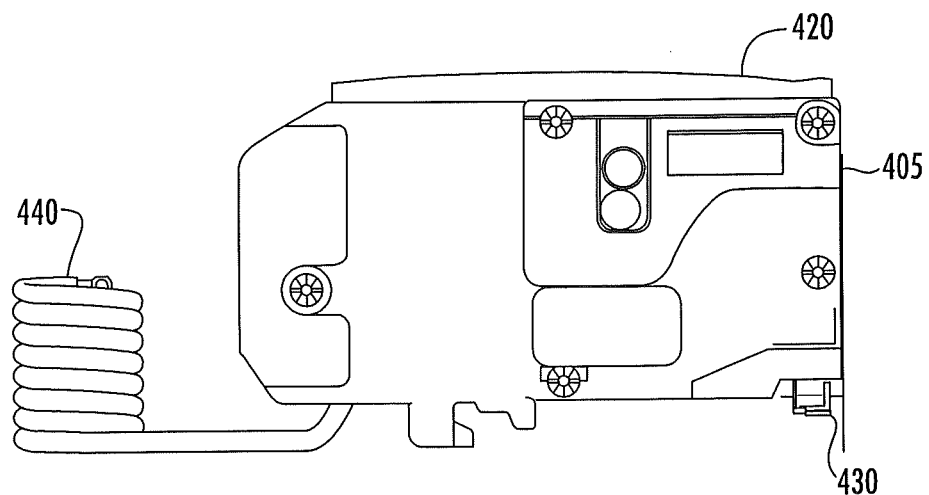
FIG. 6 is a side view of the apparatus of FIG. 4.
Figure 7:
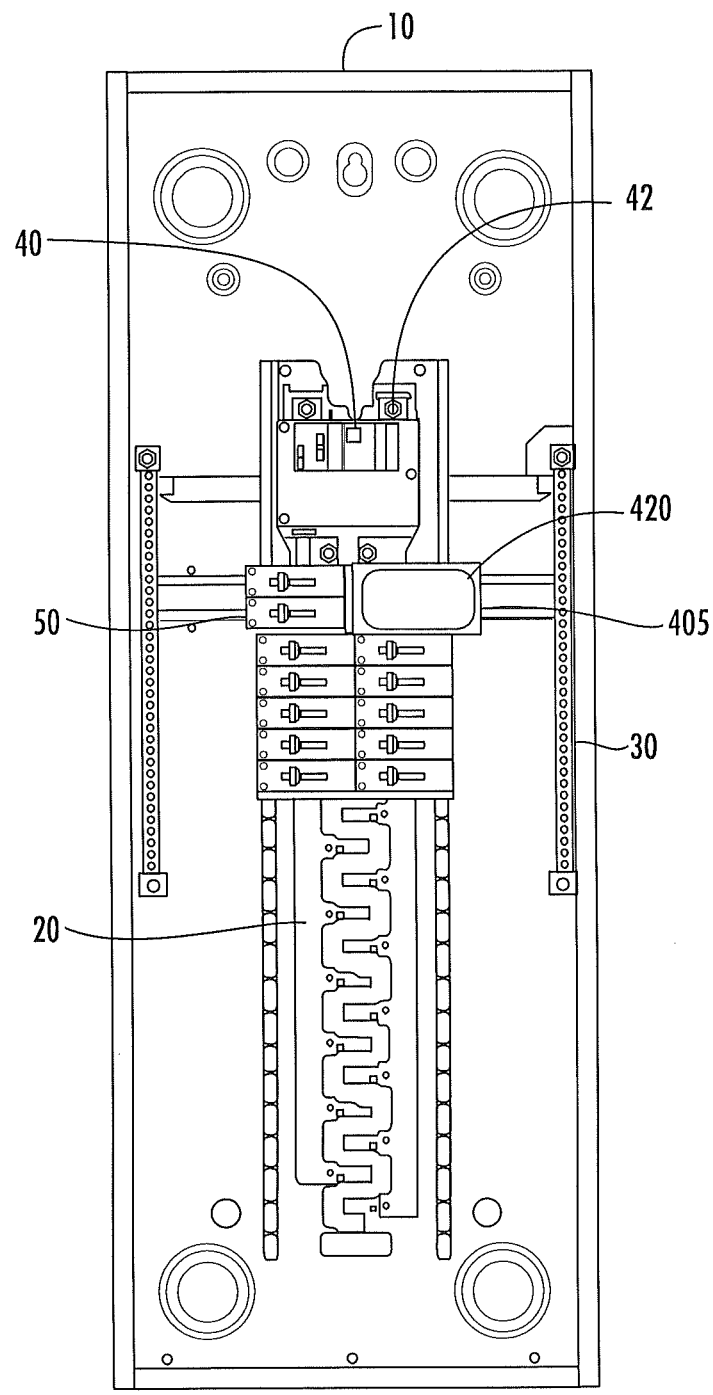
FIG. 7 illustrates the apparatus of FIG. 4 installed in a load center.

For example, referring to FIGS. 4-7, an apparatus 400 according to some embodiments may include a housing 405 configured to be installed at a branch circuit breaker position of a load center. The apparatus 400 includes an alphanumeric display 420 disposed at a face of the housing 405. At least one connector 430 is supported by the housing 405 and is configured to engage (e.g., pluggably mate with, bolt on to, or otherwise mechanically and electrically engage) at least one bus bar 20 of the load center (FIG. 6 illustrates a plug-on type connector). A control circuit 410 is disposed in the housing 405 and is configured to be coupled to the at least one on bus bar 20 via the connector 430.

The control circuit 410 may be configured to be coupled to a neutral bar 30 via, for example, a pigtail 440 or other electrical connection. The control circuit 410 may also be configured to be coupled to at least one external sensor, such as at least one current transformer 50,' using additional pigtails or other connections, such as terminal blocks or pluggable connectors supported by the housing 405. The at least one current transformer 50' may be operatively coupled to at least one conductor, such as to at least one main feeder conductor of the load center and/or to at least one branch circuit conductor of the load center, so as to sense current flowing therein.

According to some embodiments, the control circuit 410 may be configured to sense various voltages (e.g., bus voltages) and/or currents (e.g., main and/or branch circuit currents) in the load center and to perform power, energy and/or other electrical measurements related to operation of the load center and/or loads connected thereto. The control circuit 410 may be further configured to display results of such measurements on the display 420. The displayed measurements may include, but are not limited to, bus voltage, main feeder current, branch circuit current, feeder power, branch circuit power, aggregate power consumption, branch circuit power consumption and the like. The control circuit 410 may also be configured to determine status of the load center, such as alarm states relating to certain load and fault conditions, and to indicate such status on the display 420.

Figure 8:
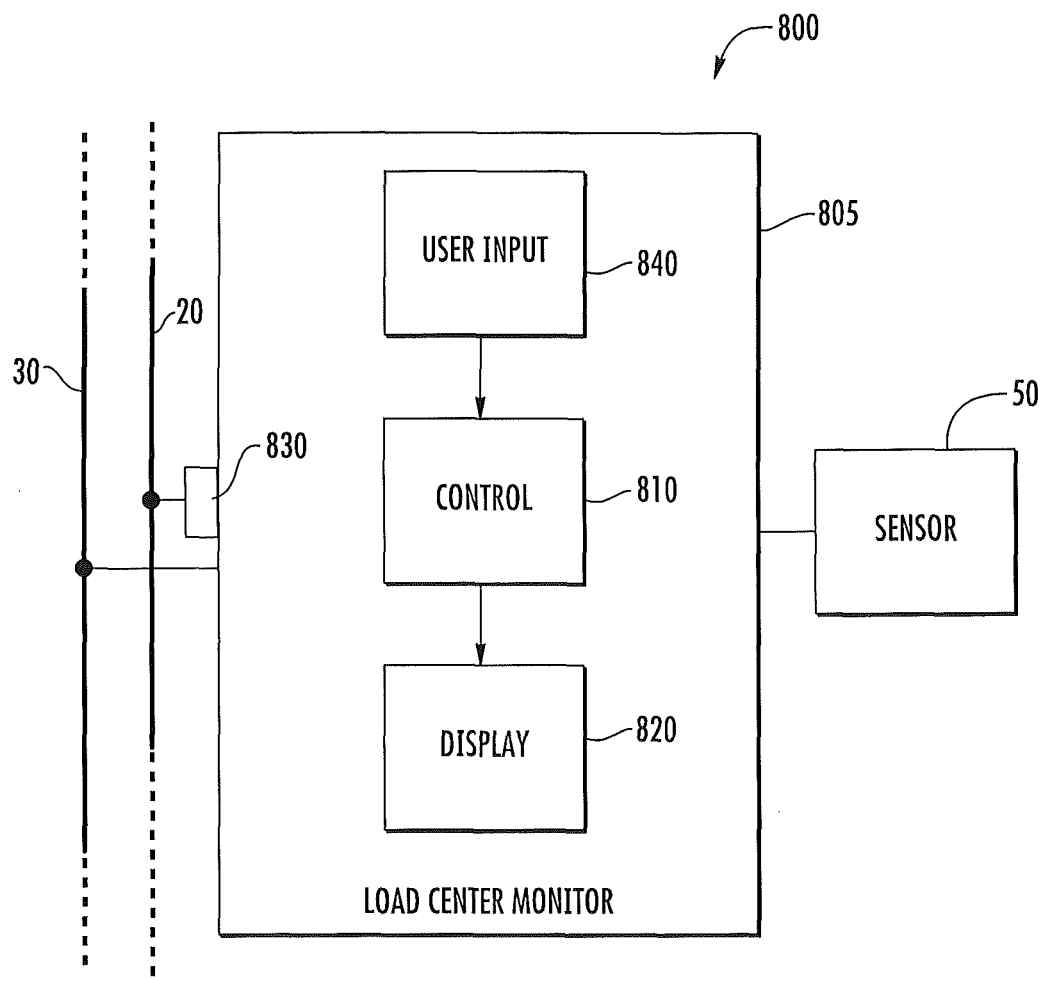
FIGS. 8 and 9 are schematic diagrams of apparatus according to still further embodiments.

As illustrated in FIG. 8, an apparatus 800 according to further embodiments may include a control circuit 810, a display 820 and at least one bus connector 830 supported by a housing 805 that is configured to be installed at a branch circuit breaker location of a load center. The apparatus 800 may further include a user input device 840 that is operatively coupled to the control circuit 810 and that enables a user at the load center to provide input to control the apparatus 800. In some embodiments, for example, the user input device 840 may include a touch screen sensor associated with the display 820 and/or a separate button or other device supported by the housing 805 and configured to accept user inputs. The user input may including, for example, commands for the control circuit 810 to display different types of information (e.g., voltage, current, power, etc.) on the display 820 and/or setup and/or calibration inputs.

Figure 9:
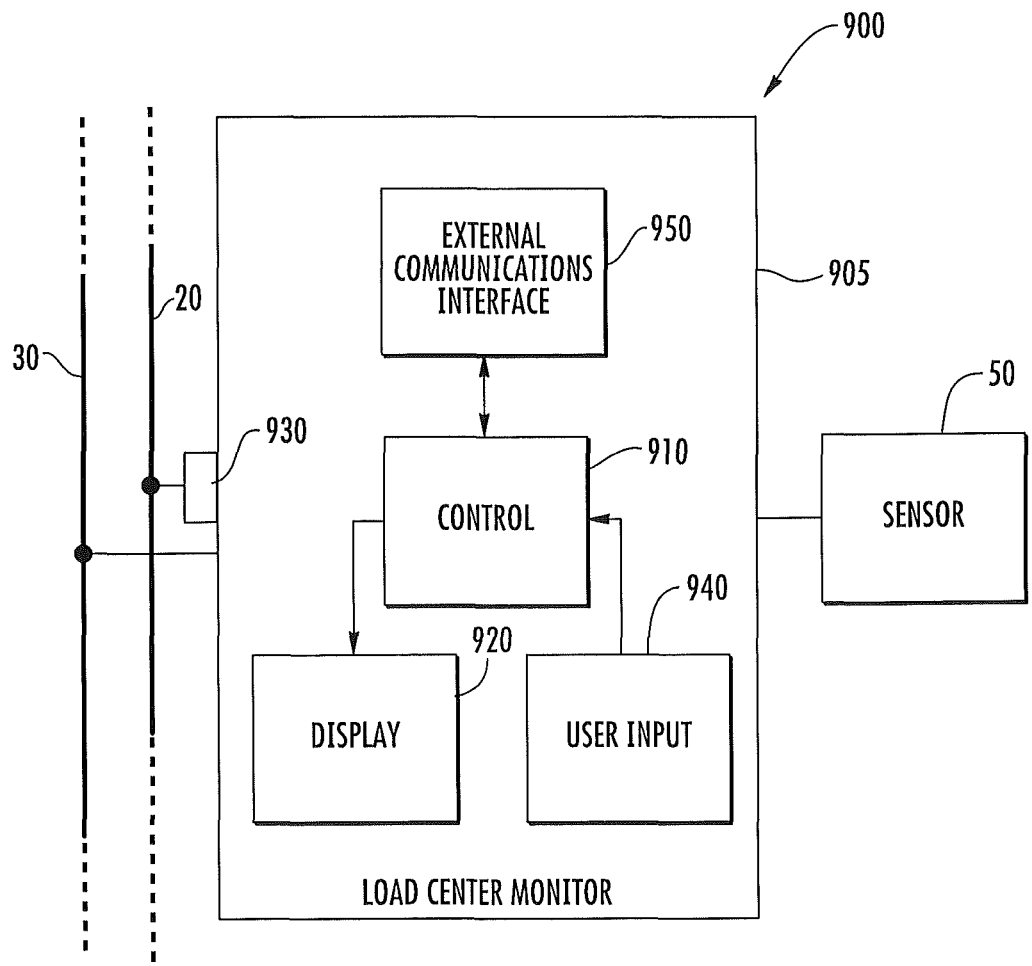

As shown in FIG. 9, an apparatus 900 according to further embodiments may include a control circuit 910, a display 920, a user input device 940, and at least one bus connector 930 supported by a housing 905 that is configured to be installed at a branch circuit breaker location of a load center. The apparatus 900 may further include an external communications interface circuit 950, operatively coupled to the control circuit 910. The communications interface circuit 950 may include, for example, wired (e.g., Ethernet or power line carrier), radio (e.g., WiFi) or optical communications circuitry, and may be used for communication of measurement data to an external monitoring device and/or for communication of measurement, display, settings and/or calibration information to the control circuit 910 from an external controller.

In the drawings and specification, there have been disclosed exemplary embodiments of the inventive subject matter. However, many variations and modifications can be made to these embodiments without substantially departing from the principles of the present inventive subject matter. Accordingly, although specific terms are used, they are used in a generic and descriptive sense only and not for purposes of limitation, the scope of the inventive subject matter being defined by the following claims.

That which is claimed:

1. An apparatus comprising:
a housing;
at least one electrical connector supported by the housing;
a graphical display disposed at a face of the housing; and
a control circuit in the housing, electrically coupled to the at least one electrical connector and configured to control the graphical display,
wherein the housing and the at least one electrical connector are configured to enable installation of the apparatus in a load center at a location suited for installation of a single circuit breaker, with the at least one electrical connector engaging one power bus bar of the load center when the apparatus is installed at the location.

2. The apparatus of claim 1, wherein the control circuit is further configured to be coupled to a sensor external to the housing.

3. The apparatus of claim 2, wherein the sensor comprises a current sensor.

4. The apparatus of claim 1, wherein the control circuit is configured to perform an electrical measurement and to display a result of the measurement on the graphical display.

5. The apparatus of claim 1, wherein the control circuit is configured to determine a status of the load center and/or a load coupled thereto and to display the determined status on the graphical display.

6. The apparatus of claim 1, further comprising a user input device supported by the housing and configured to receive a user input from a user positioned at the load center.

7. The apparatus of claim 5, wherein the user input device comprises a touch screen sensor.

8. The apparatus of claim 1, further comprising a communications circuit in the housing, operatively coupled to the control circuit and configured to communicate with a device external to the housing.

9. An apparatus comprising:
a housing;
at least one connector supported by the housing;
a control circuit in the housing, electrically coupled to the at least one connector and configured to perform at least one electrical measurement; and
an interface device supported by the housing, operatively coupled to the control circuit and configured to communicate the at least one electrical measurement to a user,
wherein the housing and the at least one connector are configured to enable installation of the apparatus in a load center at a location suited for installation of a single branch circuit breaker, with the at least one connector engaging one power bus bar of the load center when the apparatus is installed at the location.

10. The apparatus of claim 9, wherein the interface device comprises a graphical display disposed at a face of the housing.

11. The apparatus of claim 9, wherein the interface device comprises a communications circuit in the housing and configured to communicate with a device external to the housing.

12. The apparatus of claim 9, wherein the interface device is configured to accept a user input from a user positioned at the load center.

13. The apparatus of claim 9, wherein the control circuit is further configured to determine a status of the load center and to cause the interface device to communicate the determined status.

14. An apparatus comprising:
a housing;
at least one electrical connector supported by the housing;
an alphanumeric display disposed at a face of the housing; and
a control circuit in the housing, electrically coupled to the at least one electrical connector and configured to perform at least one electrical metering operation and to display a result of the at least one electrical metering operation on the alphanumeric display,
wherein the housing and the at least one electrical connector are configured to enable installation of the apparatus in a load center at a location suited for installation of a single circuit breaker, with the at least one electrical connector engaging one power bus bar of the load center when the apparatus is installed at the location.

15. The apparatus of claim 14, further comprising a user input device supported by the housing, operatively coupled to the control circuit and configured to accept a user input from a user at the load center, wherein the single circuit breaker location has a form factor associated with a branch circuit breaker.

16. The apparatus of claim 14, further comprising a communications circuit in the housing, operatively coupled to the control circuit and configured to communicate the result of the at least one electrical metering operation to a device external to the housing.

\* \* \* \* \*